United States Patent [19]
Vidovich

[11] Patent Number: 5,736,883
[45] Date of Patent: Apr. 7, 1998

[54] WIDE RANGE PHASE SHIFT WITH SINGLE ADJUSTMENT

[75] Inventor: Nikola Vidovich, San Jose, Calif.

[73] Assignee: Pixel Instruments Corp., Los Gatos, Calif.

[21] Appl. No.: 610,907

[22] Filed: Mar. 5, 1996

Related U.S. Application Data

[63] Continuation of Ser. No. 399,021, Mar. 6, 1995, abandoned.

[51] Int. Cl.[6] .................................................. H03H 11/26
[52] U.S. Cl. ............................ 327/276; 327/283; 327/278
[58] Field of Search ............................. 327/240, 248, 327/250, 252, 276, 278, 283, 285; 333/138, 139

[56] References Cited

U.S. PATENT DOCUMENTS

| | | | |
|---|---|---|---|
| 2,526,321 | 10/1950 | Beverly | 333/138 |
| 2,631,232 | 8/1953 | Barackel | 333/138 |
| 3,183,448 | 5/1965 | Strother et al. | 333/138 |
| 3,284,804 | 11/1966 | Sell | 333/138 |
| 3,806,794 | 4/1974 | Vidovic | 327/237 |
| 4,701,714 | 10/1987 | Agoshen | 327/283 |
| 4,829,257 | 5/1989 | Cooper | 328/133 |

Primary Examiner—Timothy P. Callahan
Assistant Examiner—Jung Ho Kim
Attorney, Agent, or Firm—J. Carl Cooper

[57] ABSTRACT

The present invention provides precision adjustment of an electronic signal over a range greater than 360° with a single control input which may be either mechanical or electrical.

38 Claims, 8 Drawing Sheets

L1　　　　　　　　　　L2

WIDE RANGE PHASE SHIFT WITH SINGLE ADJUSTMENT

This application is a continuation of application Ser. No. 08/399,021, filed Mar. 8, 1995, now abandoned.

BACKGROUND OF THE INVENTION

The present invention relates to adjustable phase shifting with a wide range of adjustment accomplished with a single adjustment device and, in particular, to adjustment of chroma subcarriers in television systems, and the like over a range of more than 360° with a single potentiometer. In particular, single control adjustment of over 360° range with very minimum temperature drift is highly desirable.

In present systems, adjustable RC and LC circuits are typically utilized for low cost precision phase shifting, however these circuits typically only provide less than 180° of adjustment per control. It is thus necessary to cascade three or more circuits, or to provide a switch selectable phase shift in conjunction with a continuous adjustment circuit to have over 360° of adjustment range. This cascading of circuits and the use of multiple switches and/or adjustment controls is undesirable from a cost and complexity standpoint. In addition, it is often difficult to reduce thermal and time related drift of such circuits.

Other solutions are used in present systems, such as utilizing phase locked loops with limited phase shifts coupled with frequency multipliers. For example, if a 1 MHz carrier with a 120° phase shift is tripled to 3 MHz, a 360° phase shift results. For color subcarrier, a 3.58 MHz signal can be reduced to ¼ the frequency, or 0.895 MHz, phase shifted 100° with a single control circuit and then multiplied by 4 back to 3.58 MHz with a 400° phase shift. Such a circuit provides a nice user friendly phase shift, but is expensive and difficult to temperature compensate.

Solutions such as shown in U.S. Pat. No. 4,829,257, issued May 9, 1989 are useful but require special phase shift networks to provide a plurality of phase shifted versions of the subcarrier as well as tapped potentiometers or multiplier or mixing circuits.

In color television systems, it is frequently necessary to provide adjustment of signals such as sampling clocks, color subcarriers, reference signals and other phase coherent signals by more than a full period, or 360°, and to accomplish this adjustment with high accuracy with a single control and at low cost.

SUMMARY OF THE INVENTION

In accordance with the present invention, a phase shift circuit it shown which circuit has the ability to shift the phase of a signal by more than 180° with a single control. A combination of two such circuits is shown having a single electrical or mechanical control input to control the amount of phase shift over a range greater than 360° while using only amplifiers, inductors, capacitors and resistors. While the circuit may very well be used with fixed component values to achieve a stable phase shift, it is envisioned to be most useful in an adjustable fashion. In the present specification and claims resistance, inductance and capacitance will be referred to as R, L and C, respectively and are intended to cover both the components and circuits exhibiting these properties as well as the properties themselves. While they may be used, no transformers, delay lines, variable capacitors, variable inductors or tapped pots need to be used other than one pot with a single variable tap for the phase adjustment. Thus the invention provides an apparatus for shifting the phase of an electronic signal comprising two individual circuits which are a first R,L,C circuit which is responsive to the input signal to shift the phase thereof to provide a first phase shifted version in response to adjustment of one of said R, L or C component values, and a second R, L, C circuit responsive to this first phase shifted version to provide a further phase shift thus providing a further phase shifted version of the signal in response to adjustment of one of said R, L or C component values with the same one of the R, L or C being adjusted for both said circuits via a common circuit or mechanism.

While this invention is shown in its preferred form for use in shifting the phase of a 3.58 MHz subcarrier for television systems, it will be understood that the circuit may be used for phase shifting with any type of signal which has a phase related characteristic.

DESCRIPTION OF THE PREFERRED EMBODIMENTS

The phase shifter of the preferred embodiment of the present invention is designed so that a single potentiometer controls the phase responses of two series L, C circuits in the opposite directions. The first L, C circuit is controlled from 0° to +190° and the second circuit from −190° to 0°. This method yields excellent phase linearity versus control position, better then ±5° from a true linear control position versus phase relationship.

It is well known that R, L, C circuits can not product a phase shift larger than 180 degrees. In typical real world circuits, the achievable phase shift is less than 180° due to imperfect components, for example potentiometers which do not have a resistance range from 0 to ∞, and inductors which exhibit some resistance. It is shown in the present disclosure how to increase the real world phase shift range of these R, L, C circuits to above 180 degrees by adding a feed-forward current source which supplies signal current to the resistor.

Figure 1:
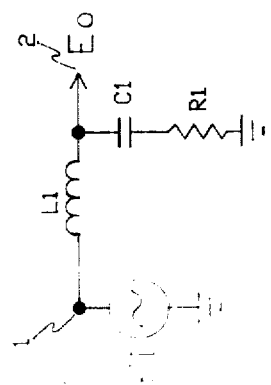
FIG. 1 is a schematic prior art phase shift network.

FIG. 1 is a schematic of a phase shift network comprised of signal source $E_i$, coupled to input 1, series inductor L2 and shunt network C2 in series with R2 with the phase shifted output signal $E_o$ coming from output 2 at the L2/C2 junction. While theoretically capable of 180° phase shift adjustment as R2 is varied from 0 to ∞, in actual practice the achievable phase shift is somewhat less. This circuit will be used as a basis for illustrating the inventive concepts of the present invention, thus the actual range of phase shift is unimportant for understanding the operation and features of the present invention.

As mentioned above, the phase shift may be increased to over 180° by adding a current source. The current source is not shown, but would be connected from the signal input to the top of the resistor, thus injecting signal induced current through the resistor to ground.

The transfer function for the circuit is given by:

$$E_o = E_i \frac{1 + j\omega R2C2}{1 - \omega^2 L2C2 + j\omega R2C2}$$

Figure 2:
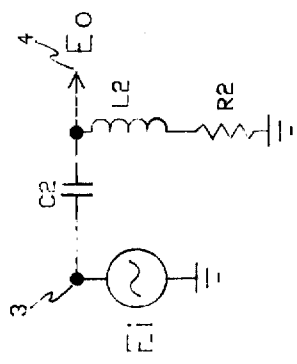
FIG. 2 is a schematic prior art phase shift network.

FIG. 2 is a schematic of a phase shift network similar to FIG. 1, comprised of signal source $E_i$ coupled to input 3, series capacitor C1 and shunt network L1 in series with R1. Output $E_o$ is taken from output 4. Again, the current source is not shown, but would be coupled the same as in FIG. 1.

The transfer function for the circuit is given by:

$$E_o = E_i \frac{1 - jR1/\omega L1}{1 - 1/(\omega^2 L1C1) - jR1/\omega L1}$$

In the circuits of FIGS. 1 and 2, for a single frequency, the values for R1, L1, C1, R2, L2 and C2 may be chosen so that the amplitude response is constant for any resistor value and the phase response is controlled by the resistor. Thus substituting a variable resistor for R1 or R2 will result in an adjustable phase response with fixed amplitude response at the chosen frequency. It may be noted that the variable resistor R1 or R2 may very well be implemented with any of a variety of signal controlling devices or circuits, for example multipliers or photo resistors, but will be described here as simple variable resistors for ease of teaching of the preferred embodiment. In addition, while it is preferred to adjust the resistor value to effect phase adjustment, if some amplitude variation is permitted then phase adjustment may also be made by adjusting the L or C value. Simultaneous adjustment of L or C values may be had for example by use of mechanically adjustable components on the same mechanical actuator, for example ganged capacitors or ganged inductors as is commonly known. As an example of use of a ganged capacitor, one section provides the first circuit C and the other section provides the second circuit C. The capacitance of one section is increased while the other is decreased by rotation of the rotor. Similarly, ganged inductors may also be used.

Additionally, electronic adjustment may be used such as with varactor diodes which vary capacitance with voltage or gyrator circuits vary inductance with voltage. Electronically simulated resistor, capacitor or inductor components may be utilized and circuitry for such components may be found in many application notes and handbooks published by manufacturers of analog integrated circuits. Such manufacturers include Philips and National of Sunnyvale, Calif.

The frequency response of the circuit of FIG. 1 is:

$$T(\omega) = (1 + j\omega RC)/(1 - \omega^2 LC + j\omega RC)$$

When $\omega^2 LC = 2$, the response changes to:

$$T(\omega) = -(1 + j\omega RC)/(1 - j\omega RC)$$

The frequency response of the second circuit, for $\omega^2 LC = 0.5$, is:

$$H(\omega) = -(1 - jR/\omega L)/(1 + jR/\omega L)$$

The phase response of $T(\omega)$ is:

$$-2 \arctan(\omega RC)$$

And the phase response of $H(\omega)$ is:

$$2 \arctan(R/\omega L)$$

Figure 3:
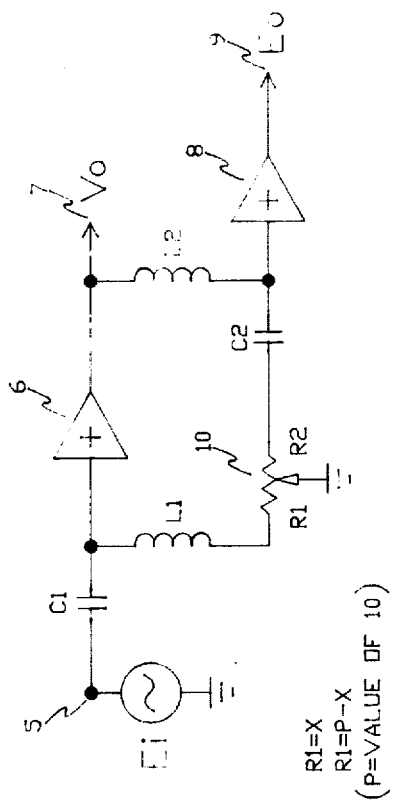
FIG. 3 is a schematic of a first embodiment of the present invention.

Both circuits may be coupled together with a single potentiometer with the wiper connected to ground as shown in FIG. 3. FIG. 3 has input 5 coupled to signal source $e_i$ with C1, L1 and R1 connected as in FIG. 1. The output of the first phase shift section is taken from the C1/L1 junction and is buffered by amplifier 6 to provide isolation between the two circuits. The first phase shifted signal $V_o$ 7 from amplifier 6 is coupled to L2, C2 and R2 as in FIG. 2 to provide a second phase shift. The output of this circuit is buffered in amplifier 8 to provide output signal $E_o$ at output 9.

Since the single potentiometer 10 now provides the variable resistance component for each circuit, the two circuits now provide cascaded phase adjustment for a single control element which is the wiper of 10. As one circuit moves away from −180° toward 0° with rotation of the control, the other circuit simultaneously moves away from 0° toward +180°. Thus a control movement gives double the phase shift when used in both circuits as compared to the phase shift when used with only one circuit. Again, while the function of phase shifting described for simplicity as a potentiometer, it will be understood that this function may be implemented with any well known circuit or component which is capable of varying the signal amplitudes of the signal coupled to it. In addition, as previously pointed out, the phase shifting may very well be carried out with a variable capacitor or inductor.

FIG. 3 shows the same components L1, L2, C1 and C2 as in FIGS. 1 and 2 with R1 and R2 of FIGS. 1 and 2 being the two sections of the potentiometer, which is preferred to have a linear taper. The movable tap, or wiper on the potentiometer is coupled to signal ground, which is simply shown as ground. Thus, as the grounded tap on the potentiometer is moved in a given direction, the resistance which is taken from R1 is added to R2 and vice versa when moved in the other direction.

The circuit of FIG. 3 also includes two unity gain amplifiers or buffer, of the type commonly known in the art. The gain of one or both of the amplifiers may be selected to other than unity as desired in order to accommodate desired signal level and component value characteristics, and may be coupled to the phase adjustment to cause one or both amplifier gains to track the phase adjustment. Such is especially true if variable capacitance or inductance adjustment is used.

When one section of the potentiometer increases the other side decreases. After substitution of $y = x/P$, $a = \omega PC1 = P/\omega L2$ the output frequency response becomes:

$$F(Y) = [(1 + jay)/(1 - jay)][(1 - ja(1-y))/(1 + ja(1-y))]$$

And the phase response becomes:

$$\theta(Y) = 2 \arctan(ay) - 2 \arctan(a(1-y))$$

Figure 4:
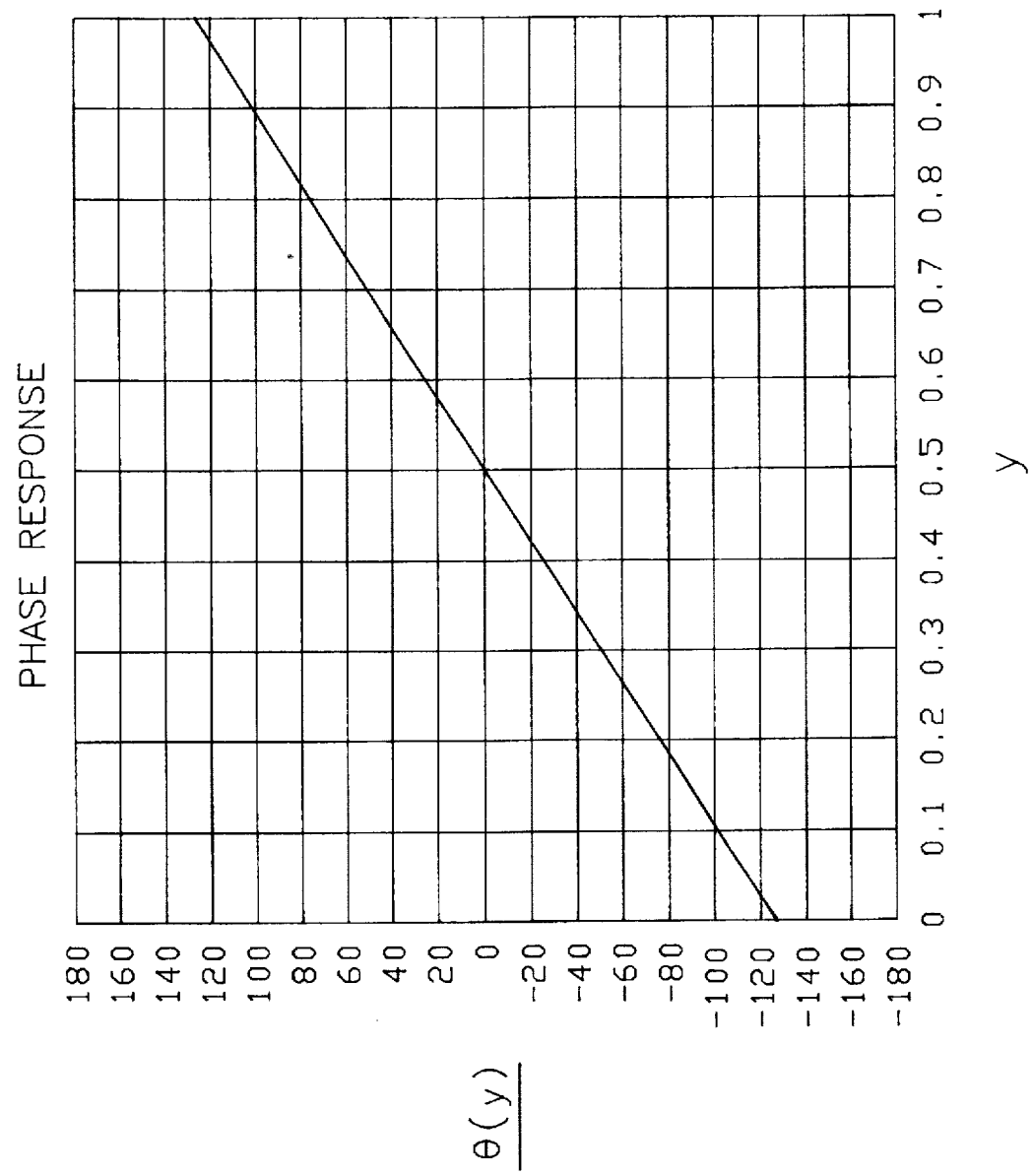
FIG. 4 is a plot of the phase response of FIG. 3.

The phase response for the circuit of FIG. 3 is shown graphically in FIG. 4 where the vertical axis is phase in degrees and the horizontal axis is rotation of the potentiometer. The most linear response is obtained for a=2. The phase range in this case is ±180 degrees.

The theoretical phase range for each circuit section can be increased to over 180 degrees by adding a portion of the input voltage to the variable resistor as previously stated with respect to FIGS. 1 and 2. The same is true for the embodiment of FIG. 3 as shown in FIG. 5.

Figure 5:
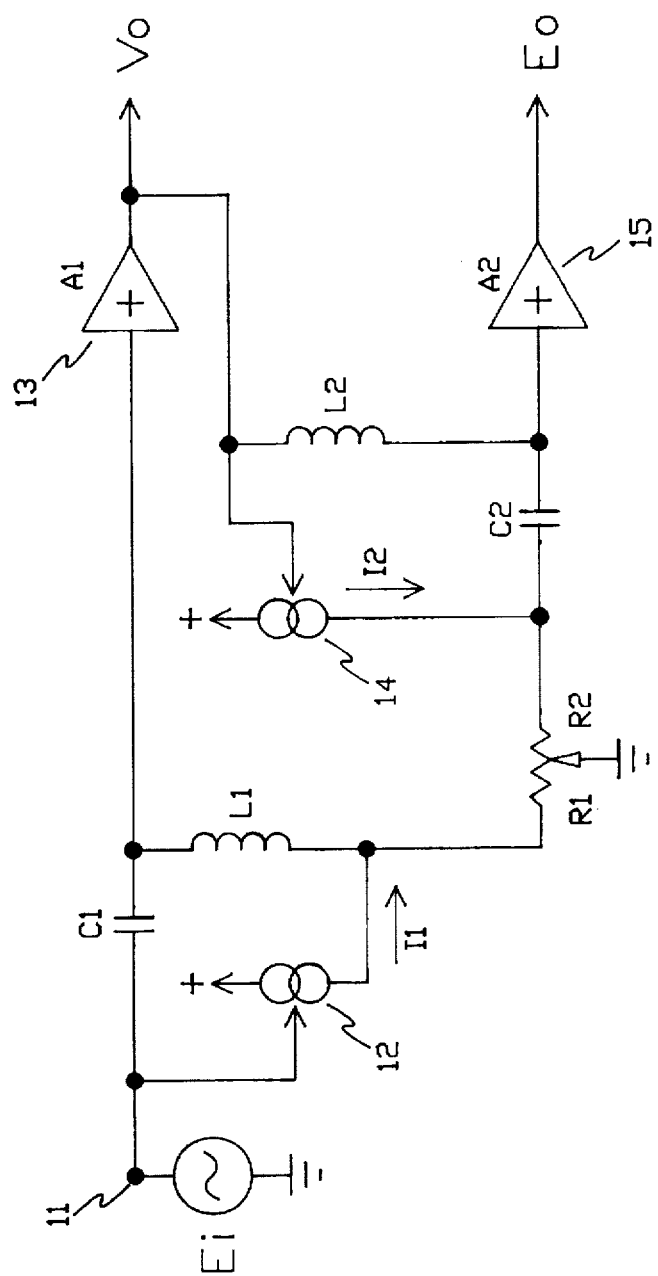
FIG. 5 is a schematic of a second embodiment of the present invention.

FIG. 5 shows the same circuit as FIG. 3 with input 11, amplifiers 13 and 15 and in addition current sources 12 and 14 which provide currents I1 and I2 respectively into resistors R1 and R2. The current sources may be implemented with any of the types which is commonly known in the art to provide constant currents responsive to the input signal and first phase shifted signal as shown. It should be noted that the current sources do not source D.C., but rather source a current which is proportional to the signal to which it is coupled. The current sources thus must be capable of operating at the frequency of interest. Various devices such as transistors, FETs, constant current diodes, OP AMPS and others may be utilized for these components as will be apparent to one skilled in the art from the teachings herein.

By adding the constant current to the two resistors, each resistor and associated circuit has its phase shift increased to over 180°, thereby providing a total phase shift for the entire circuit of over 360°. The gain factor α of the current sources is chosen to be the same for both sources in order that they be matched to achieve the best phase versus rotation linearity.

It should be noted however that while it is preferred to have two matching current sources to achieve best phase vs rotation linearity, it is possible to practice the invention with a single current source, since a single current source is sufficient to increase the circuit's theoretical range which approaches 360° to beyond 360°.

The frequency response of the circuit shows that the real part of each section, 1-2α, provides additional phase shift larger than ±90 degrees. The parameter α then compensates for or increases the phase difference from the actual 130 degrees as shown in FIG. 4 to the desired 190 degrees.

The response of the circuit of FIG. 5 may be expressed as:

$$E_o = E_i \frac{1 - 2\alpha y + j\alpha y}{1 - j\alpha y} \cdot \frac{1 - 2\alpha(1-y) - j\alpha(1-y)}{1 + j\alpha(1-y)}$$

Where
$\omega^2$ L2 C2=2
$\omega^2$ L1 C1=0.5
α=1.2
a=2

Figure 6:
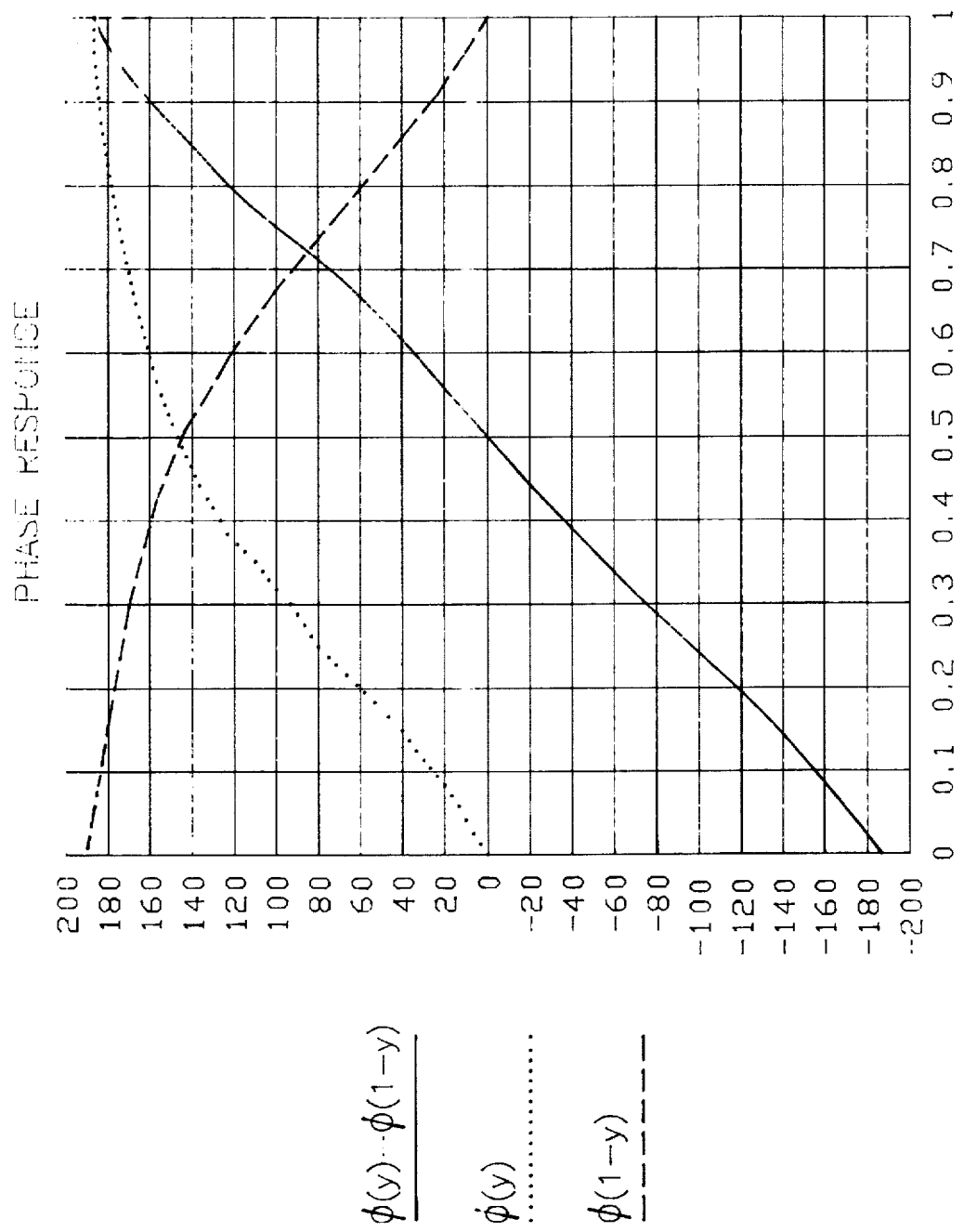
FIG. 6 is a plot of the phase response of FIG. 5.

FIG. 6 is a plot of the phase response of the circuit of FIG. 5 showing the individual phase responses of each section and the resultant phase response of the two combined.

It is quite apparent from the teachings herein that the very linear phase response, as shown graphically in FIG. 6, is a result of the subtraction which causes the two otherwise nonlinear curvatures to compensate each other in the final output.

Figure 7:
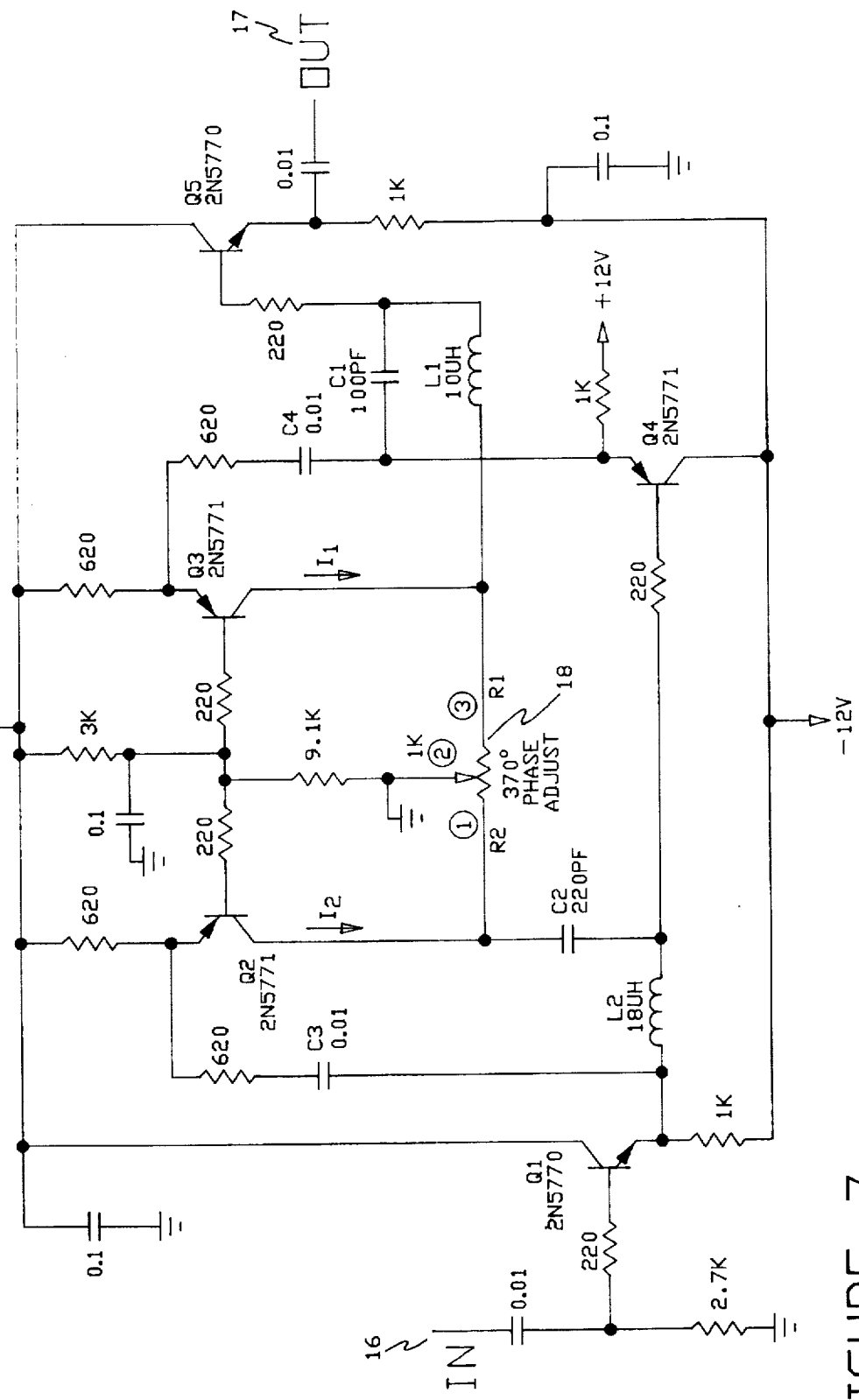
FIG. 7 is a schematic of the preferred embodiment of the present invention.

FIG. 7 is a schematic of the preferred embodiment of the present invention when used to implement a phase shifter for a 3.58 MHz subcarrier. FIG. 7 has input 16, output 17 and phase control 18. Component values for the circuit are given and components R1, C1, L1, R2, C2 and L2 are labeled corresponding to the previous Figures. Note however that the L2, C2 is implemented on the left side of the circuit whereas these components appeared on the right side of FIG. 5. The order of the two phase shifting sub-circuits makes no difference in the practice of the preferred embodiment of the invention, and may be reversed as desired. The input signal is coupled through a first buffer Q1 on the left and applied through L2 and C2 to the phase adjustment P. The current source for this section is provided by Q2 which receives the input signal via C3 and the associated 620 Ω resistor to provide current $I_2$. The second section is comprised of buffer Q4 which supplies C1 and L1 which couples to phase adjustment P. Q3 provides the current source for this section in response to the buffered signal from Q4 via C4 and associated 620 Ω resistor to provide current $I_1$. Q5 is configured as a buffer to provide the output phase shifted signal on the right.

The other unlabeled components of the circuit of FIG. 7 comprise biasing, coupling, bypassing and degeneration components which are well known in the art. While FIG. 7 operates well, it will be recognized that there are numerous variations which may be resorted to to implement the invention. As just a few examples, the buffers and current sources which are implemented with bipolar transistors may very well be implemented with FETs or OP AMPS. The resistors, capacitors, inductors may be implemented with equivalent circuits as previously discussed. In particular, if the circuit is to be implemented on an integrated circuit, the inductors may be implemented with gyrators or any others of the various well known equivalents. As used in the present application, the words resistor, resistance, capacitor, capacitance, inductor and inductance, when used without any particular limitation as to the form or method of implementation, are meant to include the equivalent function implemented by alternative circuitry.

In particular, the phase adjust resistor may be implemented with components or circuits other than the tapped variable resistor shown. What is necessary is that the level of the signal present at the junction of Q2 and C2 be varied in level in inverse relation to the level of the signal present at the junction of Q3 and L1.

Figure 8:
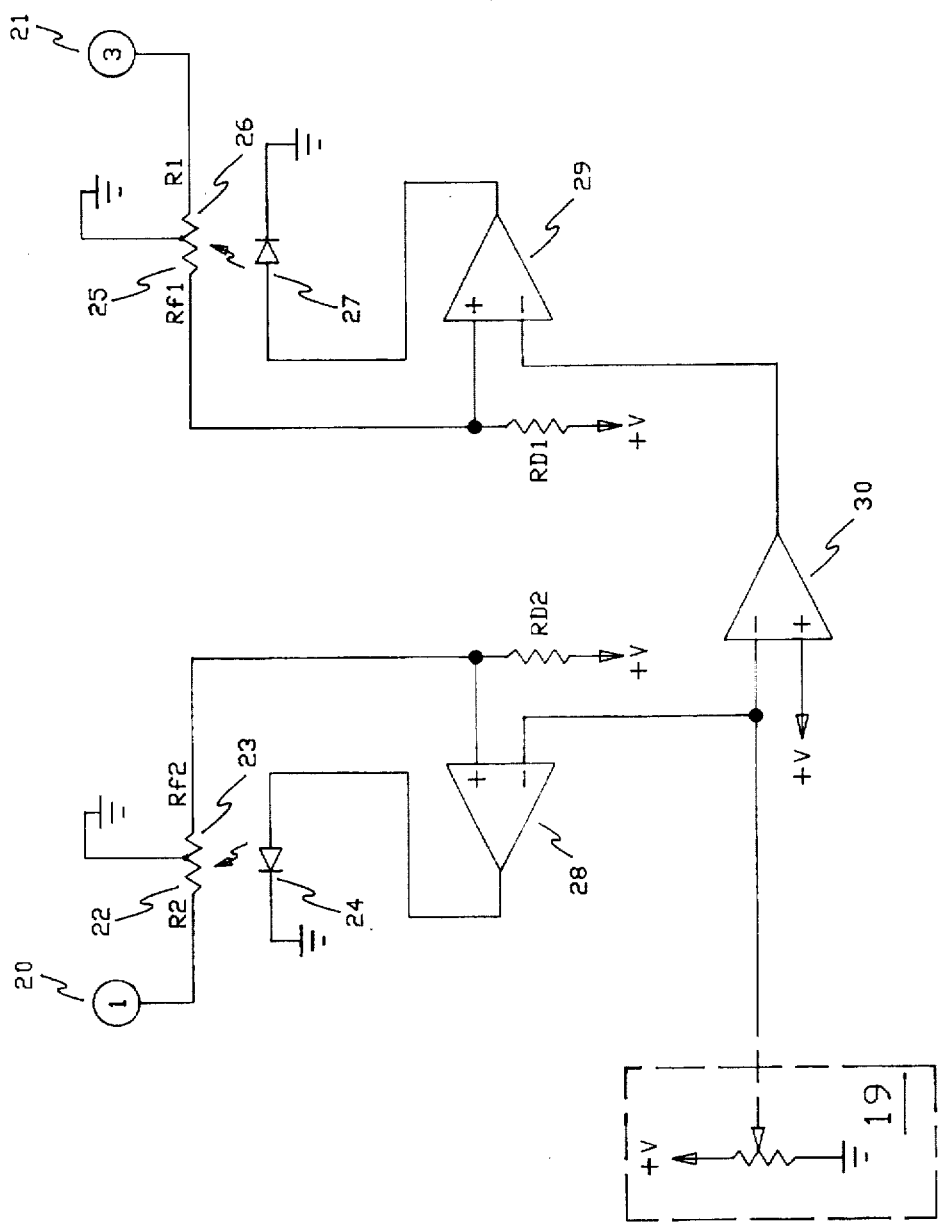
FIG. 8 is a schematic of an circuit to provide electrical adjustment of phase in the circuit of FIG. 7.

FIG. 8 shows a circuit which may be used to replace the mechanical potentiometer of FIGS. 7, 5 or 3 to provide D.C. control of the phase shift which D.C. may be provided with a simple potentiometer or other D.C. source 19 located some distance from the circuit. With respect to FIG. 7, terminal 1 of the potentiometer is to be connected as shown at 20, terminal 3 is to be connected as shown at 21. Resistor R2 is provided by the left half of the left tapped photo resistor 22 and Resistor R1 is provided by the right half of the right photo resistor 26. Both photo resistors use the other half, 23 and 26 as feedback components which are arranged in a voltage divider with resistor RD1 and RD2 respectively. Difference amplifiers 28 and 29 sense the voltage at the voltage divider with their +inputs, and compare it to the control voltage on their −inputs. Inverting amplifier 30 provides the inverse of the control voltage from 19 for use by 29.

In operation, a voltage which ranges from 0 to +V is provided by 19 to select a phase. Amplifier 30 inverts the control voltage, thus providing a +V to 0 voltage in response to a 0 to +V input. Difference amplifier 29 compares the voltage from the RD2/RF2 divider. If the voltage of the divider is higher than the control voltage, the amplifier 29 increases its output which in turn passes more current through LED 24 thus increasing the light output. As the light output of the LED increases, the resistance of resistors R2 and Rf2 decreases. The decreased resistance of Rf2 causes the voltage on the +input of 28 to decrease. The action continues until the inputs to 28 are equal at which point 28 maintains its output voltage at the level necessary to maintain equal voltage at its inputs. The opposite will take place if the voltage at the +input should be lower than the control input on the −input of 28. Thus as the voltage from 19 is adjusted, the resistance of R2 is varied.

The right side of the circuit operates in the same manner as the left, with amplifier 29, LED 27, resistors 25 and 26 and RD1 operating the same as 28, 24, 23, 22 and RD2 respectively. Accordingly, resistor 26 will increase proportionately as resistor 22 decreases. The circuit is thus an electronic equivalent of a mechanical potentiometer.

Figure 9:
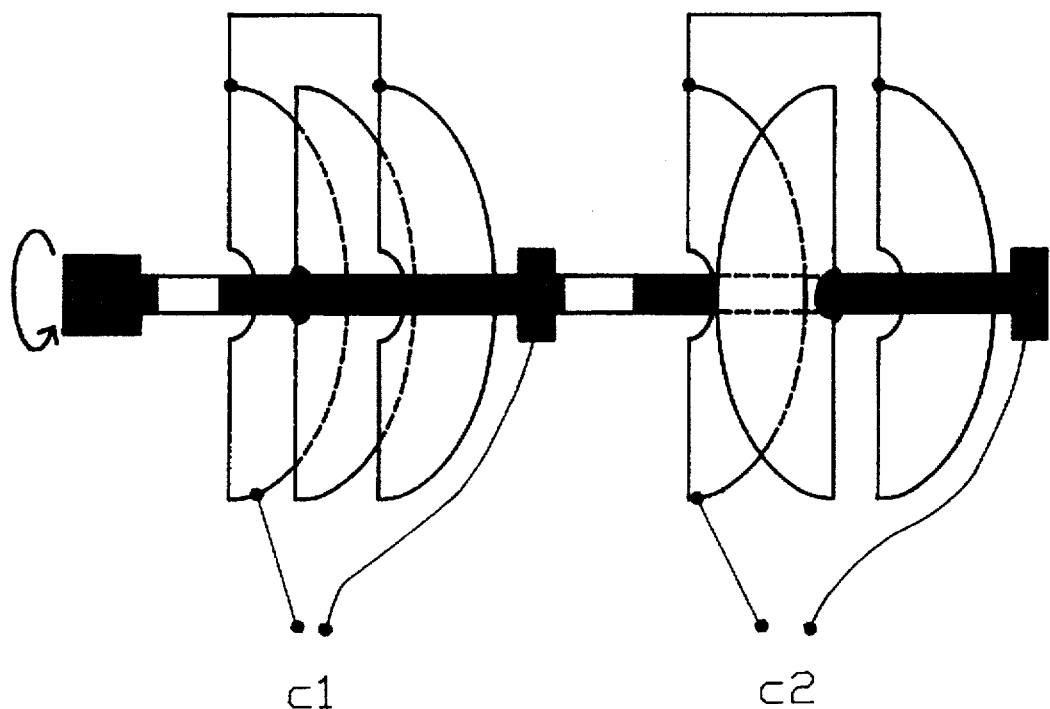
FIG. 9 is a diagram of a prior art dual capacitor.

FIG. 9 shows prior art dual variable capacitors which may be utilized for C1 and C2 of FIGS. 3, 5 or 7. It will be seen that each of the capacitors C1 and C2 have their rotor vanes mounted on a common dielectric adjustment shaft such that as one capacitor is increased in value the other is decreased. C1 is shown at maximum and C2 at minimum.

Figure 10:
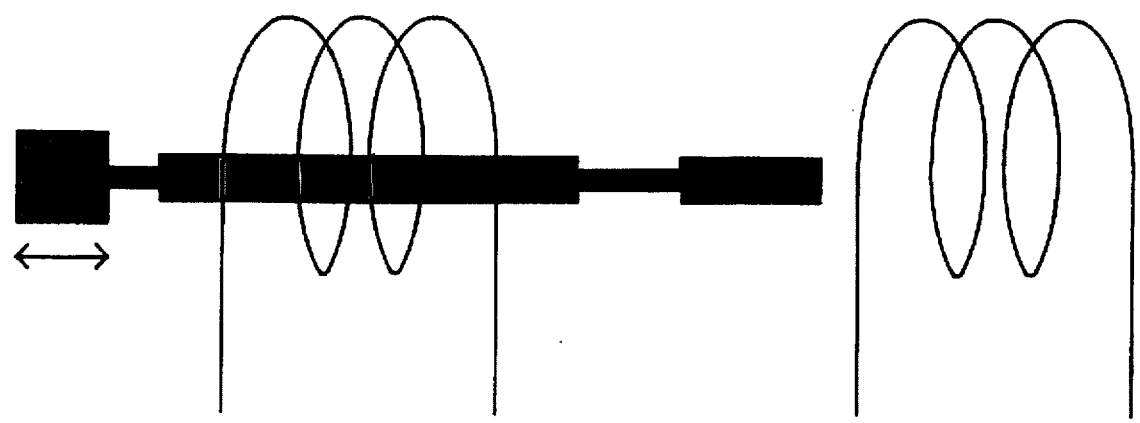
FIG. 10 is a diagram of a prior art dual inductor.

FIG. 10 is a prior art dual inductor which may be utilized for L1 and L2 of FIGS. 3, 5 or 7. It will be seen that as the tuning slug is adjusted out of one coil, the other tuning slug is adjusted into the other coil. This action causes one inductor to be increased in value as the other is decreased.

Other such control of phase may be implemented with a digital potentiometer, multiplier, multiplying DAC, FET, Transistor, photo diode, photo resistor or any other signal varying component or circuit or combination of components or circuits as are well known to those in the art and which will be known to be utilized to practice the invention in a particular application as will be understood and appreciated from the teachings herein. In this respect it will be understood that the inventor intends the words variable resistor, variable resistance and phase adjustment means to encompass not only the express resistance, but other variations of such devices as enumerated above, in both this disclosure and the claims.

One skilled in the art will of course be able to select components and design specific circuitry to implement the present invention to be utilized for specific applications with a variety of signal types from the teachings given herein. What is important to the practice of the invention is the use one or both of input or output signal driven current sources to feed current into the phase shift section(s), preferably utilizing both in a fashion such that the non linearities which are created cancel. Also important is to use complimentary phase shift sections to provide double phase shift with a single variable resistor control.

What is claimed is:

1. An apparatus for adjustably shifting the phase of an input signal comprising:
   a first circuit having a first set of R, L and C components and responsive to said input signal to cause a first phase shift thereto to provide a first phase shifted signal, with the amount of said first phase shift being responsive to adjustment of the value of one of said first R, L or C components,
   and a second circuit having a second set of R, L and C components and responsive to said first phase shifted signal to cause a further phase shift thereto thus providing a further phase shifted signal, the amount of said further phase shift being responsive to adjustment of the value of one of said second R, L or C components,
   wherein the same component of R, L or C component is adjusted for both said circuits such that when said value of one of said same components increases said value of said other one of the same components correspondingly decreases.

2. An apparatus for adjustably shifting the phase of an input signal comprising:
   a first R, L and C circuit responsive to said input signal to shift said phase thereof by a first phase shift to provide a first phase shifted signal, with the amount of said first phase shift being responsive to adjustment of one of said first R, L or C values,
   and a second R, L and C circuit to further phase shift said first phase shifted signal thereby providing a further phase shifted signal, with the amount of said further phase shift being responsive to adjustment of one of said second R, L or C values,
   wherein the same one of said R, L or C is adjusted for both said circuits, and
   wherein a current source which is responsive to said input signal is coupled to said first R.

3. An apparatus for adjustably shifting the phase of an input signal comprising:
   a first R, L and C circuit responsive to said input signal to shift said phase thereof by a first amount to provide a first phase shifted signal, with said first amount shift being responsive to adjustment of the value of one of said first R, L or C,
   and a second R, L and C circuit responsive to further phase shift said first phase shifted signal thereby providing a further phase shifted signal, with the amount of said further phase shift being responsive to adjustment of the value of one of said second R, L or C,
   wherein the same one of said R, L or C is adjusted for both said circuits, and
   wherein a current source which is responsive to said first phase shifted version is coupled to said second R.

4. An apparatus for adjustably shifting the phase of an input signal comprising:
   a first R, L and C circuit responsive to said input signal to shift said phase thereof by a first amount to provide a first phase shifted signal, with the amount of said first phase shift being responsive to adjustment of the value of one of said first R, L or C,
   and a second R, L and C circuit responsive to further phase shift said first phase shifted signal thereby providing a further phase shifted signal, with the amount of said further phase shift being responsive to adjustment of the value of one of said second R, L or C,
   wherein the same one of said R, L or C is adjusted for both said circuits, and
   wherein a current source which is responsive to said input signal is coupled to said first R and a second current source which is responsive to said first phase shifted signal is coupled to said second R.

5. An apparatus as claimed in claim 1, 2, 3 or 4 wherein to achieve said phase shift of said input signal in a given direction, said value of said first R and said value of said second R are adjusted in opposite directions.

6. An apparatus as claimed in claim 1, 2, 3 or 4 wherein said first and said second R values are adjusted by use of mechanically variable resistances wherein when one of said R values is decreased, the other one is simultaneously increased.

7. An apparatus as claimed in claim 1, 2, 3 or 4 wherein said first R value and said second R value are adjusted by use of a potentiometer having a tapped resistance wherein said tap is coupled to signal ground such that any signal voltage which would otherwise appear on said tap is shunted to said signal ground and one side of said potentiometer provides said first R and the other side of said potentiometer provides said second circuit R with said resistances of said first R and said second R being changed by movement of said tap with a single control.

8. An apparatus as claimed in claim 1, 2, 3 or 4 wherein to achieve said phase shift of said input signal in a given direction, said values of said first and said second C are adjusted in opposite directions for each circuit.

9. An apparatus as claimed in claim 1, 2, 3 or 4 wherein said values of said first and said second C are adjusted for each circuit by use of mechanically variable capacitors wherein as one said first and second C value is decreased, the other one is simultaneously increased.

10. An apparatus as claimed in claim 1, 2, 3 or 4 wherein said values of said first and said second C are adjusted for each circuit by use of a ganged variable capacitor having a plurality of sections wherein the capacitance of a first one of said sections provides said first C and a second one of said sections provides said second C wherein said first section is coupled to be increased in capacitance when said second section is decreased in capacitance.

11. An apparatus as claimed in claim 1, 2, 3 or 4 wherein to achieve said phase shift of said input signal in a given direction said values of said first and said second L are adjusted in opposite directions for each said circuit.

12. An apparatus as claimed in claim 1, 2, 3 or 4 wherein said first and second L values are adjusted for each circuit by use of a mechanically variable inductor wherein as one L is decreased, the other said value of said L is simultaneously increased.

13. An apparatus as claimed in claim 1, 2, 3 or 4 wherein said values of said first and said second L are adjusted for each said circuit by use of a ganged variable inductor having a plurality of inductive sections wherein a first one of said sections provides said first L and a second one of said sections provides said second L wherein said first section's inductance is increased when said second section's inductance is decreased.

14. An apparatus for phase shifting a signal and having an input and an output, including in combination:

a first capacitance having sides C1-1 and C1-2 with said C1-1 coupled to said input and C1-2 coupled to the input of a first amplifier which has an output, a first inductance having sides L1-1 and L1-2 with said L1-1 coupled to said C1-2, a first resistance having sides R1-1 and R1-2 with said R1-1 coupled to said L1-2, with said R1-2 coupled to a signal ground, a second inductance having sides L2-1 and L2-2 with said L2-1 coupled to said output of said first amplifier, a second capacitance having sides C2-1 and C2-2 with said C2-1 coupled to said L2-1, a second resistance having sides R2-1 and R2-2 with said R2-1 coupled to said C2-2, with said R2-2 coupled to a signal ground, said output of said apparatus being coupled to said L2-2.

15. An apparatus as claimed in claim 14 including a current source coupled to said input of said apparatus and further coupled to provide a current to said first resistance.

16. An apparatus as claimed in claim 14 including a current source coupled to said output of said first amplifier and further coupled to provide a current to said second resistance.

17. An apparatus as claimed in claim 14 including a first current source coupled to said input of said apparatus and further coupled to provide a first current to said first resistance, and a second current source coupled to said output of said first amplifier and further coupled to provide a second current to said second resistance.

18. An apparatus for phase shifting a signal and having an input and an output, including in combination:

a first inductance having a first side L1-1 coupled to said input and a second side L1-2 coupled to the input of a first amplifier having an output, a first capacitance having sides C1-1 and C1-2 with said C1-1 coupled to L1-2, a first resistance having sides R1-1 and R1-2 with said R1-1 coupled to said C1-2 and with said R1-2 coupled to a signal ground, a second capacitance having sides C2-1 and C2-2 with said C2-1 coupled to said output of said first amplifier, a second inductance having sides L2-1 and L2-2 with said L2-1 coupled to said C2-2, a second resistance having sides R2-1 and R2-2 with said R2-1 coupled to said L2-2 and with said R2-2 coupled to a signal ground, said output of said apparatus being coupled to said C2-2.

19. An apparatus as claimed in claim 18 including a current source coupled to said input of said apparatus and further coupled to provide a current to said first resistance.

20. An apparatus as claimed in claim 18 including a current source coupled to said output of said first amplifier and further coupled to provide a current to said second resistance.

21. An apparatus as claimed in claim 18 including a first current source coupled to said input of said apparatus and further coupled to provide a first current to said first resistance and a second current source coupled to said output of said first amplifier and further coupled to provide a second current to said second resistance.

22. The apparatus as claimed in claim 14, 15, 16, 17, 18, 19, 20 or 21 wherein said output of said apparatus is output through a second amplifier.

23. The apparatus as claimed in claim 14, 15, 16, 17, 18, 19, 20 or 21 wherein said first amplifier has a gain of 1.

24. The apparatus as claimed in claim 14, 15, 16, 17, 18, 19, 20 or 21 wherein said first amplifier has a gain other than 1.

25. The apparatus as claimed in claim 14, 15, 16, 17, 18, 19, 20 or 21 wherein said output of said apparatus is output through a second amplifier having a gain of 1.

26. The apparatus as claimed in claim 14, 15, 16, 17, 18, 19, 20 or 21 wherein said output of said apparatus is output through a second amplifier having a gain other than 1.

27. The apparatus as claimed in claim 14, 15, 16, 17, 18, 19, 20 or 21 wherein said first resistance and said second resistance are simultaneously changed to control said phase shifting of said signal.

28. The apparatus as claimed in claim 14, 15, 16, 17, 18, 19, 20 or 21 wherein said first resistance and said second resistance are simultaneously changed such that said first resistance increases as said second resistance decreases to control said phase shifting of said signal.

29. The apparatus as claimed in claim 14, 15, 16, 17, 18, 19, 20 or 21 wherein said first capacitance and said second capacitance are simultaneously changed to control said phase shifting of said signal.

30. The apparatus as claimed in claim 14, 15, 16, 17, 18, 19, 20 or 21 wherein said first capacitance and said second capacitance are simultaneously changed such that said first capacitance increases as said second capacitance decreases to control said phase shifting of said signal.

31. The apparatus as claimed in claim 14, 15, 16, 17, 18, 19, 20 or 21 wherein said first inductance and said second inductance are simultaneously changed to control said phase shifting of said signal.

32. The apparatus as claimed in claim 14, 15, 16, 17, 18, 19, 20 or 21 wherein said first inductance and said second inductance are simultaneously changed such that said first inductance increases as said second inductance decreases to control said phase shifting of said signal.

33. The apparatus as claimed in claim 14, 15, 16, 17, 18, 19, 20 or 21 wherein said first resistance and said second resistance are implemented with a potentiometer having a first end a second end and a wiper wherein said first end comprises said R1-1, said wiper comprises said R1-2, said second end of said potentiometer comprises said R2-1, and said wiper further comprises said R2-2.

34. The apparatus as claimed in claim 14, 15, 16, 17, 18, 19, 20 or 21 wherein said first resistance and said second resistance are implemented with photo resistor elements.

35. The apparatus as claimed in claim 14, 15, 16, 17, 18, 19, 20 or 21 wherein said first resistance and said second resistance are implemented with tapped photo resistor elements.

36. An apparatus for adjustable phase shifting of a signal and having an input and an output, including in combination:

a capacitance and an inductance coupled in series fashion between said input and a first side of a resistance thereby forming a junction between said capacitance and said inductance, said resistance having a tap coupled to a signal ground directly in a fashion such that there is no voltage change at said tap with respect to said signal ground, a current source coupled to said input of said apparatus and further coupled to provide a current to said resistance, with one of said inductance, capacitance or resistance being adjustable, said output of said apparatus being coupled to said junction between said capacitance and said inductance.

37. A method for shifting the phase of an input signal comprising:

a first step of passing said input signal through a first circuit, said first circuit having a first resistive, first inductive and first capacitive elements, with at least one of said elements having a value which is adjustable, said first step operative to shift the phase of said input signal to provide a first phase shifted version signal, with the amount of said phase shift in said first step being responsive to said adjustment of said one of said first element's value, a second step of passing said first phase shifted version signal through a second circuit, said second circuit having a second resistive, second inductive and second capacitive elements, at least one of which said second elements having a value which is adjustable and is the same type element as said adjustable element of said first step, said second step operative to further shift the phase of said first phase shifted version signal to provide a second phase shifted version signal, with the amount of said further phase shift in said second step being responsive to said adjustment of said adjustable one of said second element's value, wherein said adjustable first and said adjustable second elements are adjusted such that the value of one increases as the other decreases for said steps.

38. A method for shifting the phase of an input signal comprising:

a first step of passing said input signal through a first circuit, said first circuit having a first resistive, first inductive and first capacitive elements, at least one of which is adjustable, said step operative to shift the phase of said input signal to provide a first phase shifted version signal, with the amount of said phase shift in said first step being responsive to adjustment of one of said adjustable first element's value, a second step of passing said first phase shifted version signal through a second circuit, said second circuit having a second resistive, second inductive and second capacitive elements, at least one of which is adjustable and is the same type element as said adjustable element of said first step, said second step operative to further shift the phase of said first phase shifted version signal to provide a second phase shifted version signal, with the amount of said further phase shift in said second step responsive to adjustment of said adjustable one of said second element's value, wherein said adjustable first and said adjustable second elements values are adjusted oppositely for said steps.

* * * * *